United States Patent [19]
Glover et al.

[11] Patent Number: 4,751,462
[45] Date of Patent: Jun. 14, 1988

[54] METHOD FOR ACQUIRING NMR DATA WHICH IS SUBJECT TO PERIODIC VARIATIONS

[75] Inventors: Gary H. Glover, Delafield; Norbert J. Pelc, Wauwatosa; James R. MacFall, Hartland, all of Wis.

[73] Assignee: General Electric Company, Milwaukee, Wis.

[21] Appl. No.: 54,348

[22] Filed: May 26, 1987

[51] Int. Cl.$^4$ ............................................. G01R 33/20
[52] U.S. Cl. ..................................... 324/309; 324/307
[58] Field of Search ........................ 324/307, 309, 312; 128/653

[56] References Cited

U.S. PATENT DOCUMENTS

| | | | |
|---|---|---|---|
| 4,567,893 | 2/1986 | Charles et al. | 128/653 |
| 4,614,195 | 9/1986 | Bottomley | 324/309 |
| 4,616,180 | 10/1986 | Compton | 324/309 |
| 4,663,591 | 5/1987 | Pelc et al. | 324/309 |
| 4,682,110 | 7/1987 | den Boef | 324/309 |
| 4,706,026 | 11/1987 | Pelc et al. | 324/309 |

OTHER PUBLICATIONS

U.S. Application Ser. No. 766,842, filed Aug. 16, 1985, "A Method for Reducing Image Artifacts Due to Periodic Signal Variations in NMR Imaging", N. Pelc and G. Glover.

Primary Examiner—Stewart J. Levy
Assistant Examiner—Louis M. Arana
Attorney, Agent, or Firm—Quarles & Brady

[57] ABSTRACT

A method for reducing image artifacts due to signal variations in the course of examining a subject using nuclear magnetic resonance (NMR) techniques includes the acquisition of NMR data for imaging the object. The NMR data is composed of a number of views. The acquisition of each view includes the implementation of a pulse sequence to generate an NMR signal and application of a magnetic gradient along at least one dimensional axis of the object. A gating technique is used to define a window during a portion of each respiratory cycle and NMR data is acquired only during each window. A view ordering technique is employed during the data acquisition by altering the magnitude of a field gradient in a nonmonotonic manner.

5 Claims, 6 Drawing Sheets

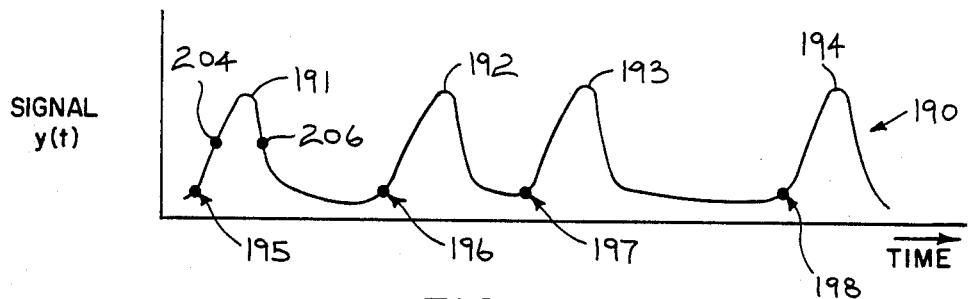
FIG. 5A
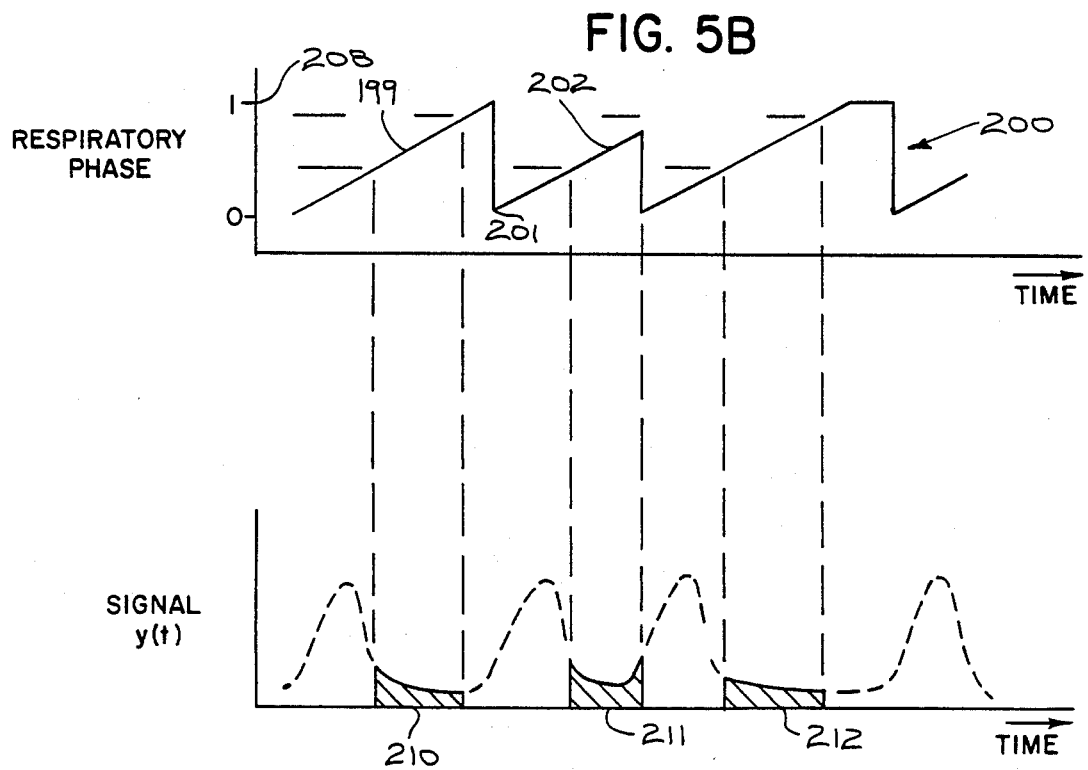
FIG. 5B
FIG. 5C

METHOD FOR ACQUIRING NMR DATA WHICH IS SUBJECT TO PERIODIC VARIATIONS

BACKGROUND OF THE INVENTION

This invention relates to nuclear magnetic resonance imaging methods. More specifically, this invention relates to a method for controlling image artifacts caused by substantially periodic NMR signal variations due, for example, to subject motion in the course of an NMR scan.

NMR has been developed to obtain images of anatomical features of human patients. Such images depict nuclear spin distribution (typically, protons associated with water and tissue), spin-lattice relaxation time $T_1$, and/or spin-spin relaxation time $T_2$ and are of medical diagnostic value. NMR data for constructing images can be collected using one of many available techniques, such as multiple angle projection reconstruction and Fourier transform (FT). Typically, such techniques comprise a pulse sequence made up of a plurality of sequentially implemented views. Each view may include one or more NMR experiments, each of which comprises at least an RF excitation pulse and a magnetic field gradient pulse to encode spatial information into the resulting NMR signal. As is well-known, the NMR signal may be a free induction decay (FID) or, preferably, a spin-echo signal.

The preferred embodiments of the invention will be described in detail with reference to a variant of the well-known FT technique, which is frequently referred to as "spin-warp." It will be recognized, however, that the method of the invention is not limited to FT imaging methods, but may be advantageously practiced in conjunction with other techniques, such as multiple angle projection reconstruction disclosed in U.S. Pat. No. 4,471,306, and another variant of the FT technique disclosed in U.S. Pat. No. 4,070,611. The spin-warp technique is discussed in an article entitled "Spin Warp NMR Imaging and Applications to Human Whole-Body Imaging" by W. A. Edelstein, et al., *Physics in Medicine and Biology*, Vol. 25, pp. 751–756 (1980).

Briefly, the spin-warp technique employs a variable amplitude phase encoding magnetic field gradient pulse prior to the acquisition of NMR spin-echo signals to phase encode spatial information in the direction of this gradient. In a two-dimensional implementation (2DFT), for example, spatial information is encoded in one direction by applying a phase-encoding gradient ($G_y$) along that direction, and then observing a spin-echo signal in the presence of a magnetic field gradient ($G_x$) in a direction orthogonal to the phase-encoding direction. The gradient present during the spin-echo encodes spatial information in the orthogonal direction. In a typical 2DFT pulse sequence, the magnitude of the phase-encoding gradient pulse $G_y$ is incremented ($\Delta G_y$) monotonically in the sequence of views that are acquired to produce a set of NMR data from which an entire image can be reconstructed.

Object motion during the acquisition of NMR image data produces both blurring and "ghosts" in the phase-encoded direction. Ghosts are particularly apparent when the motion is periodic, or nearly so. For most physiological motion, including cardiac and respiratory motion, each view of the NMR signal is acquired in a period short enough that the object may be considered stationary during the acquisition window. Blurring and ghosts are due to the inconsistent appearance of the object from view to view, and in particular, due to changes in the amplitude and/or phase of the NMR signal due to the motion.

Both blurring and ghosts can be reduced if the data acquisition is synchronized with the functional cycle of the object. This method is known as gated NMR scanning, and its objective is to acquire NMR data at the same point during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition time.

Ghost artifacts similar in character to those due to motion of the object being imaged can also be caused by other substantially periodic distortions in the NMR signals. For example, variations in the amplitude or phase of the received NMR signals may be caused by changes in the RF coil characteristics due to motion of objects not under examination. NMR signal variations may also be caused by noise sources, e.g., line frequency noise whose phase varies from view to view in a substantially periodic manner. Reduction of these artifacts is also of interest and is within the scope of the present invention. Collectively, signal distortions due to motion of the object being imaged as well as the indirect causes described above will be referred to hereinafter as periodic signal variations even when the variations are not strictly periodic.

One proposed method for eliminating ghost artifacts is disclosed in U.S. Pat. No. 4,567,893, issued on Feb. 4, 1986, and which is assigned to the same assignee as the present invention. In this prior application, it is recognized that the distance in the image between the ghosts and the object being imaged is maximized when the NMR pulse sequence repetition time is an odd multiple of one-fourth of the duration of the periodic signal variation (if two phase-alternated RF excitation pulses per view are used, as disclosed and claimed in commonly assigned U.S. Pat. No. 4,443,760, issued Apr. 17, 1984). It is recognized that this ratio can be used to alleviate ghosts due to respiratory motion. While this method, indeed, improves image quality, it does impose a constraint on the NMR pulse sequence repetition time and it often results in a longer total scan time. It also assumes that the motion is periodic. Its effectiveness is diminished when the subject's breathing is irregular because the ghosts are blurred and can overlap the image region of interest.

Another method for reducing the undesirable effects due to periodic signal variations is disclosed in copending U.S. patent application Ser. No. 766,842 now, U.S. Pat. No. 4,706,026 filed on Aug. 16, 1985 and entitled "A Method for Reducing Image Artifacts Due To Periodic Variations In NMR Imaging." In one embodiment of this method, an assumption is made about the signal variation period (e.g., due, for example, to patient respiration) and the view order is altered from the usual monotonically increasing phase-encoding gradient to a preselected order. This involves establishing the order in which either the gradient parameters, i.e. the amplitude of the phase-encoding gradient pulses (in the spin-warp method) or the direction of the read-out gradient pulses (in multiple angle projection reconstruction method) are implemented. For a given signal variation period, a view order is chosen so as to make the NMR signal variation as a function of the phase-encoding amplitude (or gradient direction) be at a desired frequency. In one embodiment, the view order is selected such that the variation period appears to be equal to the total NMR scan time (low frequency) so that the ghost artifacts are brought as close to the object being imaged as possible. In another embodiment (high frequency), the view order is chosen to make the variation period appear to be as short as possible so as to push the ghost artifacts as far from the object as possible.

This prior method is effective in reducing artifacts, and is in some respects ideal if the variation is rather regular and at a known frequency. On the other hand, the method is not very robust if the assumption made about the motion temporal period does not hold (e.g., because the patient's breathing pattern changes or is irregular). If this occurs, the method loses some of its effectiveness because the focusing of the ghosts, either as close to the object or as far from the object as possible, becomes blurred. A solution to this problem is disclosed in copending U.S. patent application Ser. No. 766,733 now, U.S. Pat. No. 4,663,591 which was filed on Aug. 16, 1985 and is entitled "A Method For Reducing Image Artifacts Due to Periodic Signal Variations in NMR Imaging." In this method, the non-monotonic view order is determined as the scan is executed and is responsive to changes in the period so as to produce a desired relationship (low frequency or high frequency) between the signal variations and the gradient parameter.

While the above "view ordering" techniques are particularly effective in dealing with ghost artifacts, local distortion and blurring in portions of the object that move significantly is still a problem.

SUMMARY OF THE INVENTION

The present invention relates to a method for reducing artifacts in an NMR image due to substantially periodic signal variations caused by events such as motion in the object being imaged. More specifically, the present invention relates to an NMR imaging method in which a view ordering technique is combined with a gated NMR scanning technique to acquire NMR data only over a selected interval of the period. Where the periodicity is caused by respiration of a human subject, for example, the gated NMR technique is employed to acquire NMR data only during a portion of the respiration cycle when motion is minimal. The view ordering technique is employed during the data acquisition "window" to further reduce ghosting and blurring artifacts.

A general object of the invention is to improve the quality of NMR images. By combining the gated NMR scanning technique with the view ordering technique, a synergistic improvement in image quality is provided. The view ordering technique is particularly useful in eliminating ghost artifacts and the gated NMR scanning technique is particularly useful in eliminating blurring artifacts.

Yet another object of the invention is to reduce the total time necessary to acquire NMR data. The window during which NMR data is acquired during each period may be broadened as compared to that in conventional gated scanning without inordinately affecting the quality of the image. Thus, the advantages of the gated NMR scanning technique can be achieved without paying a severe time penalty.

The foregoing and other objects and advantages of the invention will appear from the following description. In the description, reference is made to the accompanying drawings which form a part hereof, and in which there is shown by way of illustration a preferred embodiment of the invention. Such embodiment does not necessarily represent the full scope of the invention, however, and reference is made therefore to the claims herein for interpreting the scope of the invention.

BRIEF DESCRIPTION OF THE DRAWINGS

FIG. 5A–5C are graphic representations of a set of respiration cycles and the phase signals which are produced therefrom and used to define gating windows according to the present invention;

DESCRIPTION OF THE PREFERRED EMBODIMENT

Figure 1:
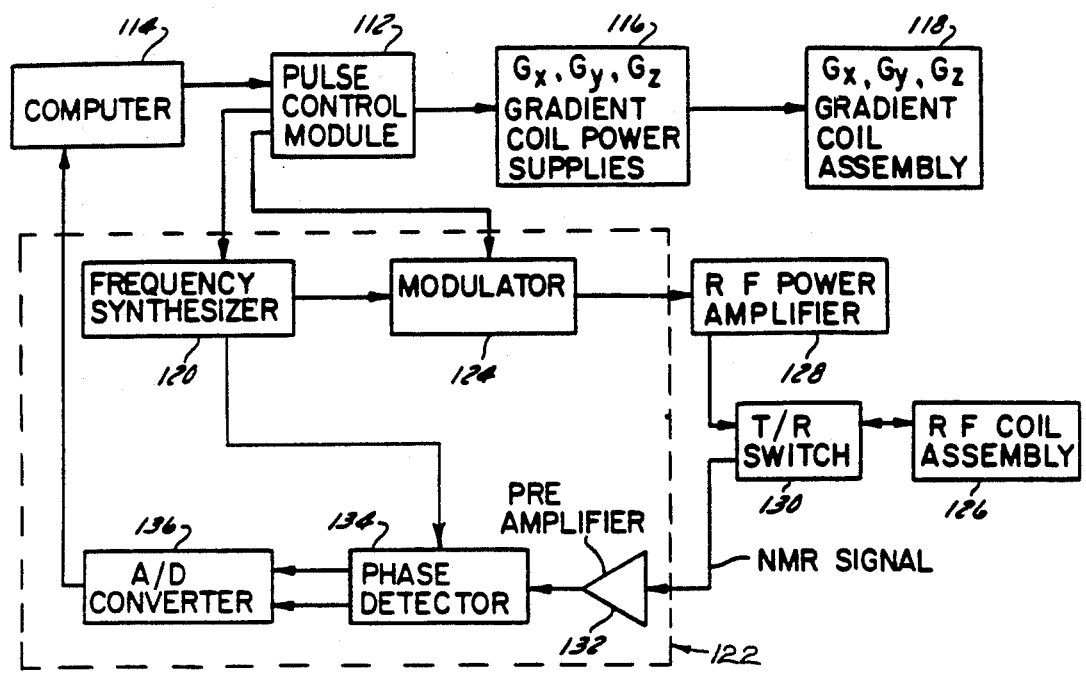
FIG. 1 is an electrical block diagram of an NMR system which employs the present invention.

FIG. 1 is a simplified block diagram of an NMR imaging system which employs the preferred embodiment of the invention. The system includes a pulse control module 112 which provides properly timed pulse waveform signals, under the control of a host computer 114, to magnetic field gradient power supplies collectively designated at 116. These power supplies 116 energize gradient coils which form part of a gradient coil assembly generally indicated by block 118. The assembly contains coils which produce the $G_x$, $G_y$, and $G_z$ magnetic field gradients directed in the x, y, and z directions, respectively, of the Cartesian coordinate system. The use of the $G_x$, $G_y$, and $G_z$ gradients in NMR imaging applications will be described hereinafter with reference to FIG. 2.

Continuing with reference to FIG. 1, the pulse control module 112 provides activating pulses to an RF synthesizer 120 which is part of an RF transceiver, portions of which are enclosed by dash-line block 122. The pulse control molule 112 also supplies signals to a modulator 124 which modulates the output of the RF frequency synthesizer 120. The modulated RF signals are applied to an RF coil assembly 126 through an RF power amplifier 128 and a transmit/receive switch 130. The RF signals are used to excite nuclear spins in a sample object (not shown) which is to be imaged.

The NMR signals from the excited nuclear spins are sensed by the RF coil assembly 126 and applied through the transmit/receive switch 130 to an RF pre-amplifier 132. The amplified NMR signals are applied to a quadrature phase detector 134, and the detected signals are digitized by A/D converter 136 and applied to computer 114 for storage and processing in a well-known manner.

Figure 2:
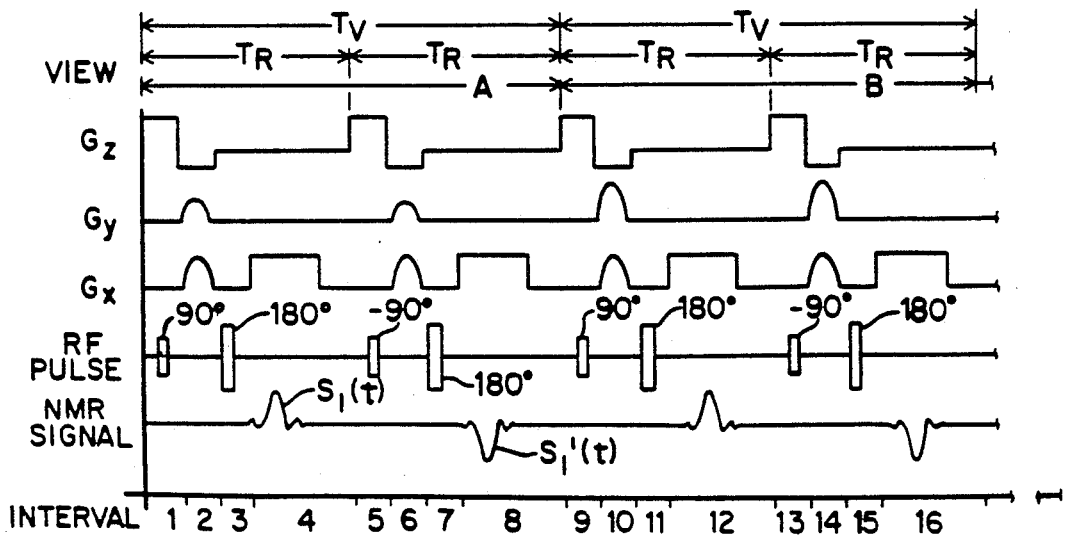
FIG. 2 is an exemplary imaging pulse sequence which is by the system of FIG. 1 while practicing the present invention.

Reference is made to FIG. 2 which depicts two views of a conventional imaging pulse sequence of the type known as two-dimensional Fourier transform (2FDT), which is frequently also referred to as two-dimensional "spin-warp." This pulse sequence is useful in obtaining, in a well-known manner, imaging NMR data to reconstruct images of an object being investigated. The two views are indicated at "A" and "B" and they are identical with the exception of the phase-encoding gradient field $G_y$. Each view is a pulse sequence which utilizes phase-alternated RF excitation pulses which, as disclosed and claimed in the above-identified U.S. Pat. No. 4,443,760, produce phase-alternated NMR signals $S_1(t)$ and $S_1'(t)$ to cancel certain baseline errors in the NMR system.

Referring now to View A in FIG. 2, there is shown in interval 1 (indicated along the horizontal axis) a selective 90° RF excitation pulse applied in the presence of a positive $G_z$ magnetic field gradient pulse. Pulse control module 112 (FIG. 1) provides the needed control signals to the frequency synthesizer 120 and modulator 124 so that the resulting exciting pulse is of the correct phase and frequency to excite nuclear spins only in a predetermined region of the object being imaged. Typically, the excitation pulse can be amplitude modulated by a $(\sin x)/x$ function. The frequency of the synthesizer 120 is dependent on the strength of the applied polarizing magnetic field and the particular NMR species being imaged in accordance with the well-known Larmor equation. The pulse control module 112 also applies activating signals to the gradient power supplies 116 to generate, in this case, the $G_z$ gradient pulse.

Continuing with reference to FIG. 2, $G_x$, $G_y$ and $G_z$ gradient pulses are applied simultaneously in interval 2. The $G_z$ gradient in interval 2 is a rephasing pulse typically selected such that the time integral of the gradient waveform over interval 2 is approximately equal to $-\frac{1}{2}$ of the time integral of the $G_z$ gradient waveform over interval 1. The function of the negative $G_z$ pulse is to rephase the nuclear spins excited in interval 1. The $G_y$ gradient pulse is a phase-encoding pulse selected to have a different amplitude in each of Views A, B, . . . , etc., to encode spatial information in the direction of the gradient. The number of different $G_y$ gradient amplitudes is typically selected to equal at least the number of pixel resolution elements the reconstructed image will have in the phase-encoding (Y) direction. Typically, 128, 256, or 512 different gradient amplitudes $G_y$ are selected and in the typical NMR system, the $G_y$ values are incremented a fixed amount from one view to the next until the NMR scan is complete.

The $G_x$ gradient pulse in interval 2 is a dephasing pulse needed to dephase the excited nuclear spins by a predetermined amount to delay the time of occurrence of a spin-echo signal $S_1(t)$ in interval 4. The spin-echo signal is produced typically by the application of a 180° RF pulse in interval 3. As is known, the 180° RF pulse is a pulse which reverses the direction of spin dephasing so as to produce the spin-echo signal. The spin-echo signal is sampled in interval 4 in the presence of a gradient pulse $G_x$ to encode spatial information in the direction (X) of this gradient.

As indicated above, baseline error components are eliminated by using an additional NMR measurement in each view. This second measurement is substantially identical to the first with the exception that the RF excitation pulse in interval 5 of View A is selected to be 180° out of phase (as suggested by the minus sign) relative to the excitation pulse in interval 1 of View A. As a result, the spin-echo signal $S_1'(t)$ in interval 8 is 180° out of phase with the spin-echo signal $S_1(t)$ in interval 4. If the signal $S_1'(t)$ is subtracted from $S_1(t)$, only those components of the signals with reversed sign in the signal $S_1'(t)$ are retained. The baseline error components thus cancel.

The process described above with reference to View A is repeated for View B and so on for all amplitudes of the phase-encoding $G_y$ gradient. The NMR data which is collected during this scan is stored in the host computer 114 where it is processed to produce image data suitable for controlling a CRT display.

Figure 3:
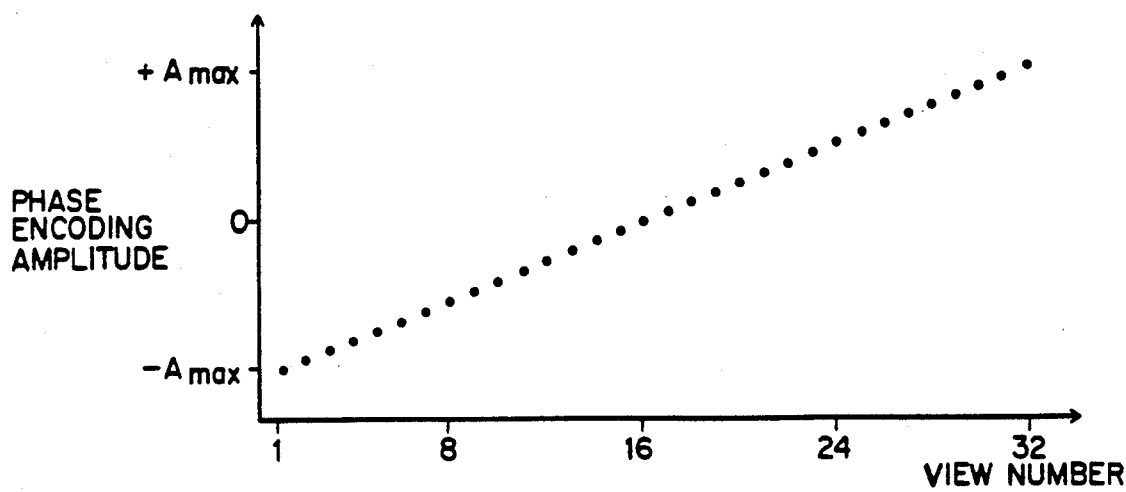
FIG. 3 is a graphic representation of a conventional monotonic view order for producing a complete image using the pulse sequence of FIG. 2.

As indicated above, a complete scan is typically performed by incrementing the value of the phase-encoding gradient $G_y$ through its entire range of values. This is illustrated in FIG. 3 where, for convenience of illustration, a scan with only 32 views is shown. Each dot represents one $G_y$ gradient field magnitude, and it can be seen that this magnitude increases linearly as a function of view number. This conventional scan is said to have a "monotonic" view order.

As the above-described conventional NMR scan is performed, NMR data is acquired from all physical locations within the plane, or slice, of the object being imaged. If an accurate image is to be reconstructed, then both the object and the measurement conditions must be stable, or fixed, during the time needed to complete the entire NMR scan. The present invention deals with the very practical situations in which this is not the case, but instead, the measurement conditions change in some cyclic, or nearly cyclic, manner.

One such situation occurs when an image is to be produced through the abdomen of a human subject. In this case, much of the material being imaged is in motion due to the subject's breathing, and the time needed to acquire the NMR data for an entire image will often transcend many respiration cycles. If NMR data is acquired continuously throughout the respiration cycles, the subject will be disposed differently from view to view and the reconstructed image will contain many motion artifacts.

One aspect of the present invention is to reduce these motion artifacts by collecting NMR data over only a portion of the respiration cycle. For example, at the end of expiration, a plateau is reached in the breathing cycle where there is relatively little motion for a short time interval. By collecting NMR data only during this short time interval, many of the motion artifacts are eliminated. This technique requires that the data acquisition sequence be enabled and disabled in synchronism with the subject's respiration, or in other words, gated on an off during each respiration cycle.

Figure 4:
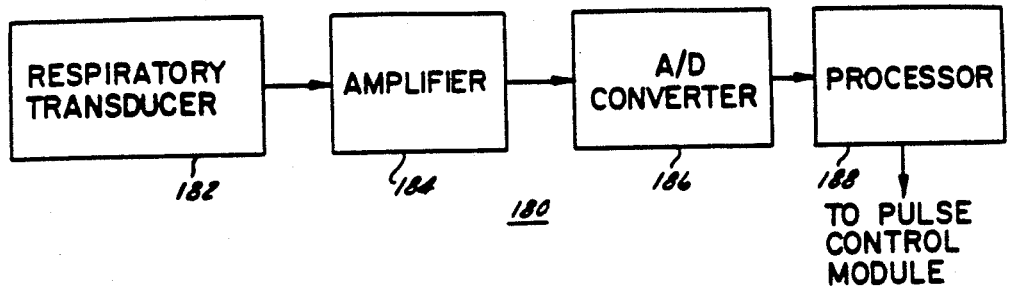
FIG. 4 is an electrical block diagram of a system for supplying respiratory phase values to the NMR system of FIG. 1.

A system, generally designated 180, capable of supplying respiratory phase values needed to gate the NMR data acquisition on and off is shown in block schematic form in FIG. 4. The system is composed of a respiratory transducer 182 which conveniently may be a pneumatic bellows with a pressure sensor for providing an electrical output signal to an amplifier 184 in response to pressure changes in the bellows. The amplified signal is digitized in an analog-to-digital (A/D) converter 186 and applied to processor 188 which calculates the needed phase values. The phase value computed by the processor 188 is applied to the pulse control module 112 (FIG. 1). FIG. 5A shows a plot of representative respiratory cycle curve 190 and the corresponding signal y(t) that is produced by the respiratory transducer 182. Four breath cycles are shown in curve 190. Signal peaks 191–194 correspond to peak inspiration when the lungs are expanded while the shallow plateaus of low signal level between the peaks correspond to end expiration.

The respiration signal y(t) is analyzed by the processor 188 to produce digital signals that indicate the phase of the respiration cycle at any moment in time. One way to generate respiration phase values is to recognize a feature in waveform 190, for example, fiducial points labelled 195–198 in FIG. 5A. Well-known signal processing methods can be used to recognize these points. Points 195–198 are assigned the same respiratory phase values, for example, zero and monotonically increasing values are assigned to points between the points labelled 195 and 196, 196 and 197, and 197 and 198. Points between points 195 and 196 are assigned monotonically increasing phase values, as indicated by segment 199 of phase waveform 200 shown in FIG. 5B. The slope of curve segment 199 is inversely proportional to the average respiration period. The average respiratory period can be calculated from the previous several (e.g., 4) respiration cycles. When the next fiducial point 196 is detected, the phase is reset to zero; e.g., at point 201 of phase curve 200. A new average respiration period can be calculated using the newly finished breathing cycle as an additional point. After point 196, the output phase again increases linearly in segment 202 of curve 200. The process continues in this way, assigning all points a phase value proportional to the time since the previous fiducial point.

Because not all breaths are of equal length, a shorter-than-average breath, such as the one between points 196 and 197, may be observed. It can be appreciated that the phase will be reset to zero prior to its reaching its expected maximum value. Some breaths, such as the one between points 197 and 198, may be longer than expected. In these cases, the phase values may have to be restricted to not rise above some value identified by numeral 208 on phase curve 200. This method will result in errors if breaths either longer or shorter than expected are observed. However, these errors will be small for small period variations. Also, since the method does rely on actual signal features and automatically adjusts for trends in the respiration period, errors are of short duration.

Improved performance can also be achieved if more than one fiducial point per cycle is recognized. For example, the points labelled 191–194 in FIG. 5A could be recognized and assigned the same phase value, the value being proportional to the fraction of the period encompassed between the two fiducial points. Using the additional fiducial points, the occurrence of a breath that is shorter or longer than average can be detected earlier in the respiration cycle and errors can be minimized.

The phase values produced by the processor 188 are employed to gate the sequence of NMR data acquisition on an off during each respiration cycle. These "windows" of data acquisition are indicated at 210, 211, and 212 in FIG. 5C. When the respiratory phase indicated in FIG. 5B reaches a lower limit (for example 0.5), NMR data acquisition is gated on during each respiration cycle. When the respiration phase reaches an upper limit (for example 0.8), the NMR data acquisition is gated off. As a result, the NMR data is acquired during a portion of each respiration cycle when motion of the subject is minimal.

In contrast to prior gated NMR scanning methods, the views are not acquired in the usual monotonic order during the successive windows of data acquisition. Instead, the order in which views are acquired is selected to take advantage of the instantaneous knowledge of respiratory phase and thereby reduce the ghost artifacts which result from the amount of motion which remains within the gating window as taught in the above-cited U.S. patent application Ser. No. 766,842. Of course, when employed in the present invention, the re-ordering applies to a segment of the respiratory cycle (from 0.5 to 0.8 in the example of FIG. 5C) rather than the entire period (0–1). In addition, because the data collection is not a continuous process, care must be taken so as not to introduce aritfacts due to abrupt changes in the dynamic equilibrium of the transverse magnetization.

Figure 6:
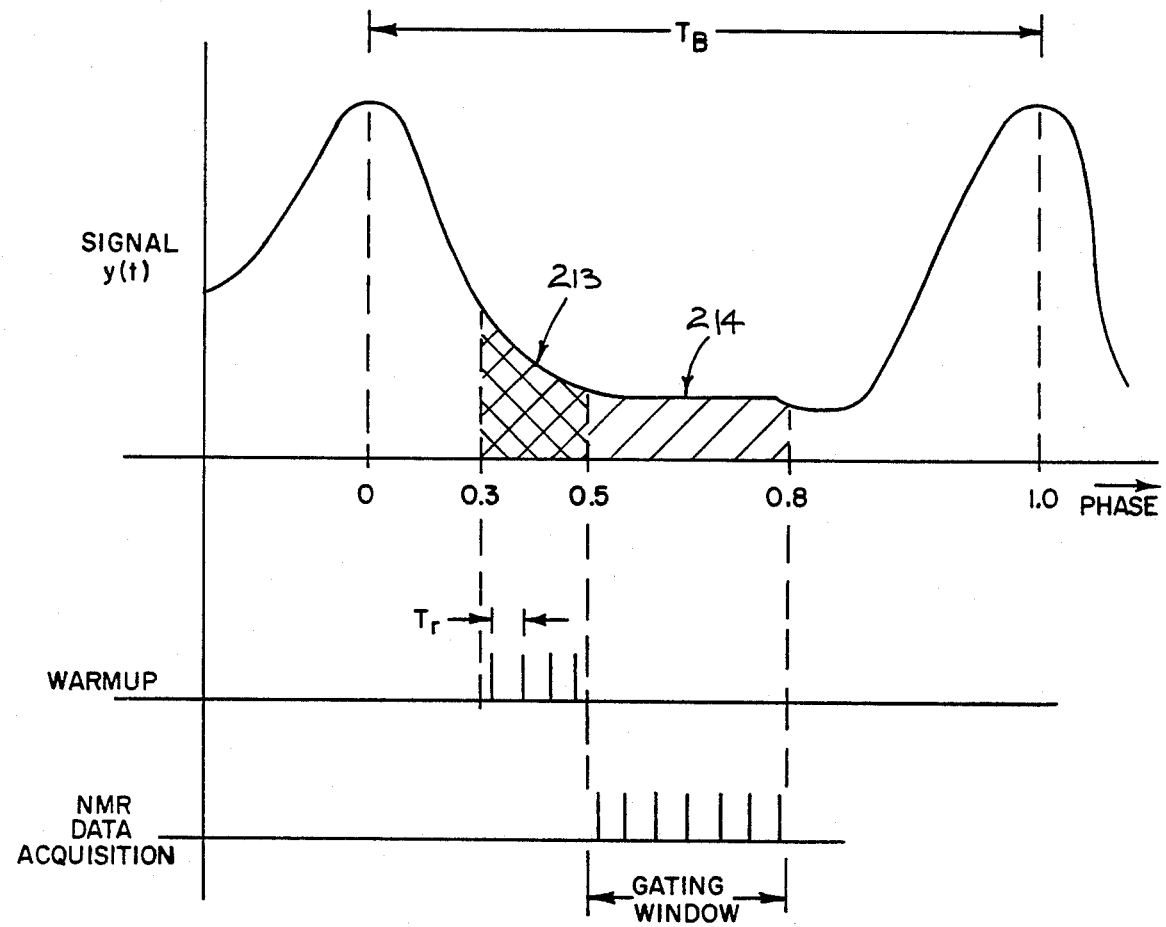
FIG. 6 is a graphic representation of one respiration cycle showing a warmup period followed by a series of NMR data measurements during the gating window.

One way to insure that the NMR equilibrium is not disturbed is to execute pulse sequences even when data are not acquired because the object is not in the desired orientation. A preferred approach is shown in FIG. 6 where each gating window is preceded by a warmup period during which three or four pulse sequences, or views, are run. This is illustrated by the cross-hatched area 213, which occurs during the respiratory phase 0.3 to 0.5. The NMR data from these warmup sequences are not acquired, but the transverse magnetization has an opportunity to reach dynamic equilibrium during warmup so that when the first data acquisition sequence is run during the gating window 214, there are no image artifacts produced. Thus, during each respiratory cycle the phase at which the warmup interval is to begin is sensed, a preselected number of warmup sequences are run, and then data acquisition is begun and continues until the end of the gating window is sensed. The phase encoding gradient $G_y$ is kept constant during the warmup sequences, but as will now be described in detail, the gradient values used during the data acquisition window are selected so as to reduce motion related artifacts.

At this point, it is helpful to describe in some detail the concepts disclosed in the aforementioned commonly assigned U.S. patent application Ser. No. 766,842. In this application, the general method is described for choosing the values of the gradient parameter (e.g., phase-encoding amplitude $G_y$) in a manner such that the disturbing effects of motion (or other signal variation producing phenomena) are diminished. Two "modes" are described. In one, the "low frequency sort mode," a view order that results in the reduction of the distance of the ghosts from the source pixel is used. In the other mode, the "high frequency sort mode," the distance of the ghosts from the source pixel is maximized. This latter mode is best implemented if the scanned field of view (FOV) in the phase-encoded direction is substantially larger than the size of the object (e.g., twice as large) so that the ghosts do not overlay structures of interest in the image. Also described in the aforementioned application are methods by which the view order can be selected.

Figure 7:
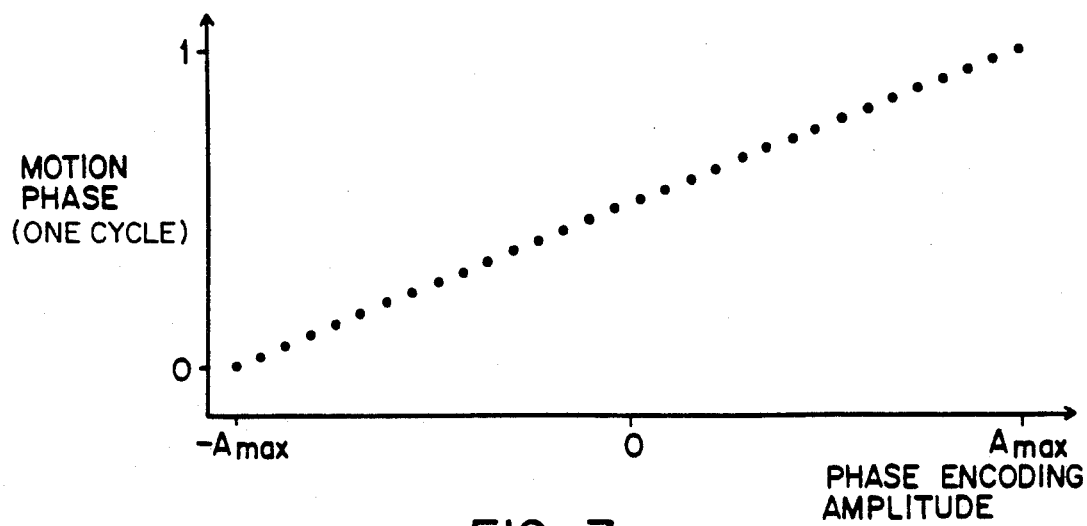
FIG. 7 is a graphic representation of the result of a low frequency view ordering method which shows phase encoding amplitude as a function of the respiratory cycle phase.
Figure 8:
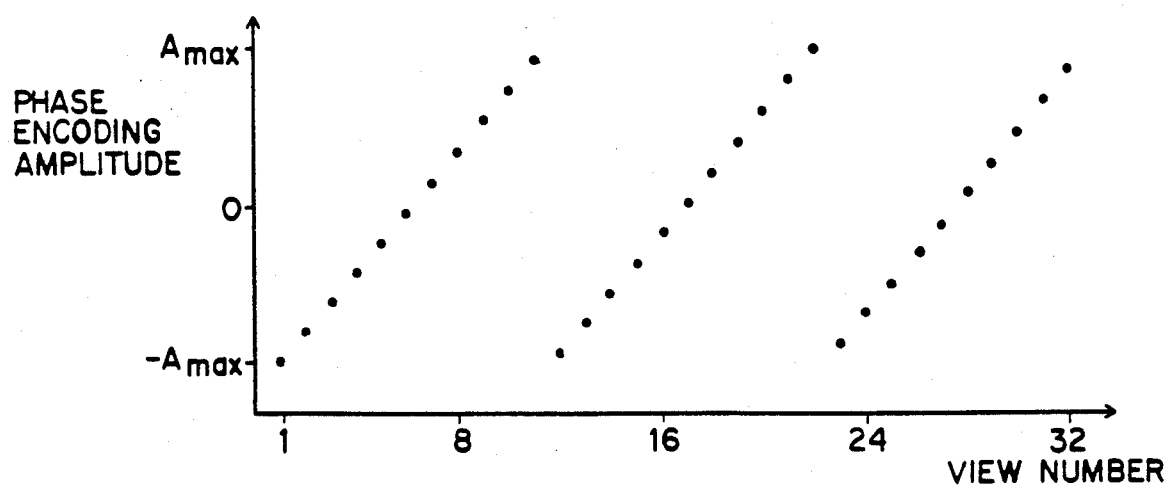
FIG. 8 is a graphic representation of an exemplary low frequency view ordering which produces the result of FIG. 7.

Basically, the goal is to select the view order so that, after the NMR data are reordered in monotonic view order, the "apparent" frequency of the motion is changed. The objective of the low frequency sort mode is to implement a view order so that the apparent period of the motion is equal to the total scan time. This can be achieved if, for example, as a result of the view order selection and subsequent reordering, the motion phase is monotonically related to phase-encoding amplitude as is shown in FIG. 7 for a 32-view example. Where the actual frequency of the respiration motion is three times the frequency at which a complete scan can be conducted (that is, the motion period is one-third of the scan time), for example, a view order such as that shown in FIG. 8 will produce this result. Compare this with the conventional monotonic view order shown in FIG. 3.

Other low frequency sort patterns can be calculated based on the total scan time and the period of the motion. For example, the motion period may be measured and a portion of this motion period may be used to acquire data. From this information, the number of views per motion cycle can be determined and the number of motion cycles required to complete the entire scan can be estimated. The view order according to the low frequency sort mode can be determined. If thirty-two views are required for a complete scan and eight motion cycles are required to obtain the NMR data during the selected data acquisition window of each cycle, then during the first motion cycle, every eighth gradient amplitude value, starting with the lowest one, is used. During the second motion cycle, every eighth value starting with the second lowest value is used, and the scan continues in this manner until all thirty-two views are collected during the eight motion cycles. When the acquired data are reordered prior to reconstruction, the object will appear to go through only one motion cycle rather than eight, and the distance between moving objects and their ghosts will be minimized.

Figure 9:
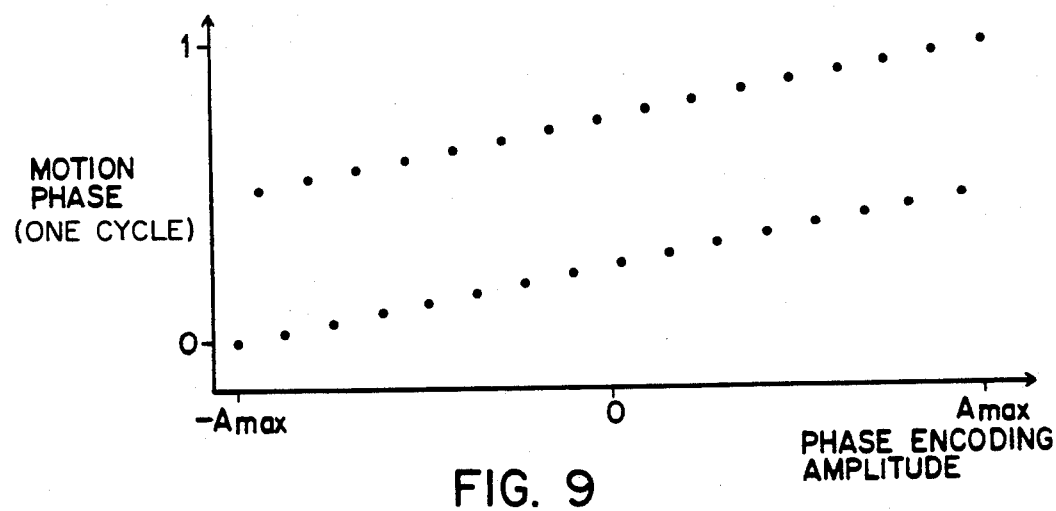
FIG. 9 is a graphic representation of the result of a high frequency view ordering method which shows phase encoding amplitude as a function of the respiratory cycle phase.
Figure 10:
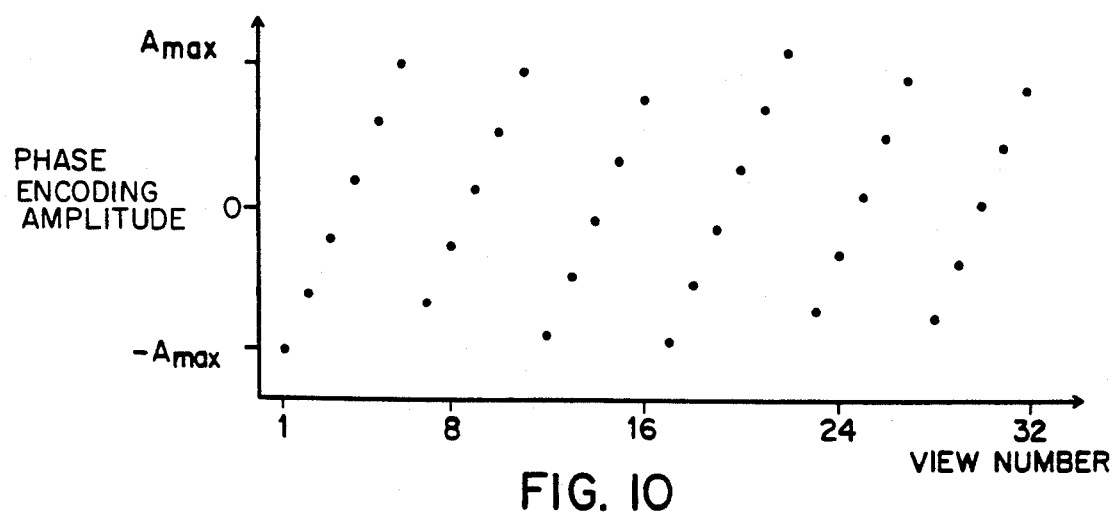
FIG. 10 is a graphic representation of an exemplary high frequency view ordering which produces the result of FIG. 9.

Another embodiment described in the aforementioned application is the "high frequency sort mode." In accordance with this embodiment, a view order is selected so that, after the acquired NMR data is reordered prior to image reconstruction, the motion appears to be at a very high frequency. If the "apparent" frequency is equal to one cycle for every two views, the ghosts will be pushed to the edge of the image. This is illustrated in FIG. 9 which shows the reordered scan and where the phase encoding amplitude $G_y$ appears to vary rapidly with phase encoding amplitude. Such an apparent frequency can be produced with the view order illustrated in FIG. 10, where it is assumed that the fundamental frequency of the respiration motion in the gating window is three times the frequency at which a complete scan can be conducted. Again, compare this view order with the monotonic view order of FIG. 3.

The high frequency view ordering method maximizes the distance between the object and the ghost, but unless the scanned field is significantly larger than the object's size, ghosts could still fall on the desired portions of the image. The scanned field of view may be increased by known techniques to provide space that does not contain interesting structures but into which ghosts can be thrown. During or after reconstruction this extra region can be discarded so that the ghosts will not be visible in the final image. The typical way to double the field of view is to double the number of views while the maximum phase-encoding amplitude $A_{max}$ is kept constant (the phase-encoding amplitude increment is halved). This ordinarily requires the scan time to be doubled if $T_r$ is kept constant. In this fashion the pixel resolution is unchanged.

A desirable method for increasing the field of view is disclosed and claimed in U.S. patent application Ser. No. 673,691, filed Nov. 21, 1984 (assigned to the same assignee and which is incorporated herein by reference). This method may be used to convert the factor of 2 normally allotted to removing signal baseline errors (the use of "chopper" pairs), as disclosed in previously referenced U.S. Pat. No. 4,443,760, into a doubling of the scanned field while still suppressing baseline effects. For example, instead of acquiring 128 chopper pairs, 256 views each with a single excitation can be acquired in which the scanned field of view is doubled. This method avoids the doubling of the scan time while it still allows the ghosts to be thrown outside the desired image region if a high frequency view ordering is used.

In both the low and high frequency view ordering embodiments, a situation may arise where a view employing a large amplitude phase-encoding gradient follows a view with a small amplitude phase-encoding gradient. Residual transverse magnetization resulting from the small amplitude phase-encoding pulse can corrupt the measurement from the large amplitude phase-encoding view with a concomitant deleterious effect on image quality. U.S. patent application Ser. No. 689,428, filed Jan. 7, 1985 (assigned to the same assignee as the present invention and which is incorporated herein by reference) discloses and claims a method for reducing such effects. One exemplary sequence for accomplishing this will be described next with reference to FIG. 11.

Figure 11:
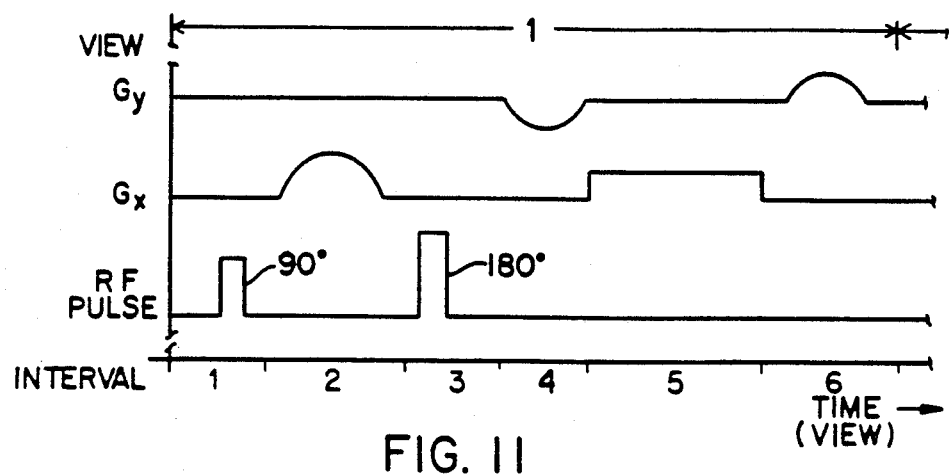
FIG. 11 is an alternative imaging pulse sequence which may be employed to reduce the effects of sudden changes in residual transverse magnetization.

Referring now to FIG. 11, the deleterious effect of residual transverse magnetization due to imperfect 180° RF pulses is avoided by delaying the application of a phase-encoding $G_y$ gradient pulse until after the application of the 180° RF pulse in interval 3. Thus, the $G_y$ phase-encoding gradient pulse is applied in interval 4. Delaying the application of the phase-encoding pulse may increase the minimum echo delay time. However, the reversing $G_y$ pulse in interval 6 is highly effective in reversing the residual magnetization effects due to the $G_y$ pulse in interval 4. The result is that, regardless of the amplitude of the $G_y$ phase-encoding gradient pulse in interval 4, the magnetization is left in the same state following each view so that $G_y$ history does not affect the measurements.

It can be appreciated that one key to the successful reduction of motion-induced artifacts is the choice of the particular view order to be used. It should also be apparent that the view order selected by the previously described method relies on substantial periodicity in the object's motion and a prior knowledge of the motion frequency. This knowledge is used, along with the total scan time for the image to select a view order prior to acquisition of the NMR data as described above. This method is ideal if the signal variations will indeed be periodic and at the assumed frequency. However, if the motion period differs from the assumed value, or varies during the scan, the efficiency of artifact reduction will be diminished.

To overcome this problem, a method for selecting the view order during the scanning process was developed and is disclosed in the above-cited co-pending U.S. patent application Ser. No. 766,733, now U.S. Pat. No. 4,663,591 which is incorporated herein by reference.

When implementing this or any other view ordering method, the cycle of motion is that segment of the respiratory cycle defined by the gating window. In other words, the motion cycle referred to above in connection with the view ordering techniques is, in fact, only a portion of the complete respiratory cycle (from 0.5 to 0.8 in the example). From the standpoint of the view ordering implementation, according to the present invention, the motion can be viewed as a continuous series of cycle segments, where each cycle segment is defined by the gating window in a full respiration cycle.

The preferred embodiments of the invention have been disclosed herein with the reference to a 2DFT imaging sequence. The invention is, however, not so limited and may, in fact, be applied to other imaging pulse sequences such as, for example, 3DFT, and the well-known two-dimensional (2D) and three-dimensional (3D) implementations of multiple angle projection reconstruction technique. Although the discussion will be limited to 2D projection reconstruction, the generalization to 3D will be understood by those skilled in the art. In 2D projection reconstruction NMR imaging, projection measurements are made at many (usually equally spaced) angles in a 180° arc. For example, projection data could be measured at one degree increments. For each of these projection measurements or views, the readout gradient direction is perpendicular to the desired projection direction. Thus, the parameter that varies from view to view is the direction of the readout gradient (analogous to the phase-encoding amplitude in 2D FT imaging). The image is reconstructed by filtering and back projecting the line integral data obtained for each direction. In projection reconstruction, it is well-known from computerized tomography (CT) scanning art that inconsistencies in the projection data, for example those due to periodic motion, are usually manifested in the image as streaks tangential to the moving (or otherwise varying) object. However, it is known that the reconstruction process is relatively insensitive to motion (or other variation) that appears as a single full cycle as a function of projection direction. The method of the invention is directly applicable to the multiple projection data if the projection angle is treated in a manner analogous to that of the phase-encoding gradient described hereinabove. For projection reconstruction, the low frequency view ordering method is preferred. That is, the projection measurements, rather than being acquired sequentially at one degree intervals, are acquired in a low frequency sort order.

While this invention has been described with reference to particular embodiments and examples, other modifications and variations will occur to those skilled in the art in view of the above teachings. Accordingly, it should be understood that within the scope of the appended claims the invention may be practiced otherwise than is specifically described.

What is claimed is:

1. A method for reducing artifacts in an image due to substantially periodic signal variations while performing examinations using nuclear magnetic resonance (NMR) techniques, the image being produced from NMR data acquired during a plurality of views and in which each view includes an NMR experiment having one NMR position encoding parameter which is varied to position encode the resulting NMR data, said method comprising:
   (a) producing a data acquisition window by sensing a signal indicative of said signal variations and defining a portion of its period over which NMR imaging data are to be acquired;
   (b) acquiring NMR data during a succession of data acquisition windows;
   (c) varying said position encoding parameter in a non-monotonic manner during the plurality of acquisition windows in such manner as to reduce image artifacts due to said substantially period signal variations during the data acquisition windows; and
   (d) reordering the acquired NMR data and reconstructing an image therefrom.

2. The method of claim 1 in which the NMR experiments performed during each of said succession of data acquisition windows is preceded by a warmup period during which an NMR experiment is performed, but the NMR data is not acquired.

3. The method as recited in claim 1 in which the non-monotonic order in which the NMR position encoding parameters are altered is determined by the frequency of the substantially periodic motion of the subject.

4. A method for reducing artifacts in an image due to substantially periodic motion of the subject while performing examinations using nuclear magnetic resonance (NMR) techniques, the image being produced from NMR data which are acquired during a plurality of views, and in which each view includes an NMR experiment having an NMR position encoding parameter which is altered from view-to-view to position encode the NMR data acquired during each view, said method comprising:
   (a) sensing the motion of the subject and producing a phase signal indicative of the position of the subject in the motion cycle;
   (b) establishing a data acquisition window for each motion cycle during which NMR imaging data are to be acquired;
   (c) acquiring NMR data during a plurality of data acquisition windows;
   (d) varying said position encoding parameter in a non-monotonic manner during the plurality of acquisition windows using said phase signal in such a manner as to reduce image artifacts due to said substantially periodic signal variations;
   (e) reordering the non-monotonically acquired NMR data to produce an ordered set of NMR data; and
   (f) reconstructing an image from the ordered set of NMR data.

5. The method as recited in claim 3 which includes:
   (a) establishing a warm-up period prior to each data acquisition window; and
   (b) performing an NMR experiment during each warm-up period so as to reduce the disturbance of the transverse magnetization equilibrium at the beginning of each data acquisition window.

* * * * *